(12) United States Patent
Andreaco et al.

(10) Patent No.: US 9,580,832 B2
(45) Date of Patent: Feb. 28, 2017

(54) PULLING HEAD HAVING A MAGNETIC DRIVE

(71) Applicant: Siemens Medical Solutions USA, Inc., Malvern, PA (US)

(72) Inventors: Mark S. Andreaco, Knoxville, TN (US); Troy Marlar, Knoxville, TN (US); Brant Quinton, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 332 days.

(21) Appl. No.: 14/519,159

(22) Filed: Oct. 21, 2014

(65) Prior Publication Data

US 2015/0114286 A1    Apr. 30, 2015

Related U.S. Application Data

(60) Provisional application No. 61/895,423, filed on Oct. 25, 2013.

(51) Int. Cl.

| | |
|---|---|
| *C30B 35/00* | (2006.01) |
| *C30B 15/30* | (2006.01) |
| *C30B 15/32* | (2006.01) |
| *C30B 13/28* | (2006.01) |
| *C30B 29/06* | (2006.01) |

(52) U.S. Cl.
CPC .............. *C30B 15/30* (2013.01); *C30B 15/32* (2013.01); *C30B 35/00* (2013.01); *C30B 13/285* (2013.01); *C30B 29/06* (2013.01); *Y10T 117/1032* (2015.01); *Y10T 117/1072* (2015.01)

(58) Field of Classification Search
CPC ......... Y10T 117/1072; Y10T 117/1032; C30B 15/30; C30B 15/32; C30B 13/285
See application file for complete search history.

(56) References Cited

U.S. PATENT DOCUMENTS

| | | | | |
|---|---|---|---|---|
| 4,708,764 | A * | 11/1987 | Boden | ..................... C30B 13/32 117/15 |
| 4,850,424 | A * | 7/1989 | Mitani | ..................... F24H 7/002 126/263.03 |
| 5,009,865 | A * | 4/1991 | Boden | ..................... C30B 13/32 117/15 |
| 5,882,397 | A * | 3/1999 | Iino | ......................... C30B 15/30 117/13 |

(Continued)

*Primary Examiner* — Matthew Song

(57) ABSTRACT

A pulling head for a crystal growth furnace. The pulling head includes a servomotor and a rotatable housing attached to the servomotor, wherein the housing includes first, second, third and fourth housing magnets. The pulling head also includes a shaft attached to a scale and a connection device having first and second connection magnets. The first connection magnet is arranged between the first and second housing magnets to generate first and second magnetic repulsion forces and the second connection magnet is arranged between the third and fourth housing magnets to generate third and fourth magnetic repulsion forces. A rotation coupling is attached between the shaft and the connection device wherein the scale weighs the shaft, rotation coupling and the connection device. The servomotor rotates the housing and rotation of the housing is transmitted by the magnetic repulsion forces to the connection device to rotate the connection device.

20 Claims, 4 Drawing Sheets

(56) References Cited

U.S. PATENT DOCUMENTS

| | | | | |
|---|---|---|---|---|
| 5,910,216 A | * | 6/1999 | Nakamura | C30B 15/30 117/218 |
| 5,997,641 A | * | 12/1999 | Kawabata | C30B 15/305 117/218 |
| 6,139,633 A | * | 10/2000 | Nishiura | C30B 15/30 117/208 |
| 2003/0200915 A1 | * | 10/2003 | Kimura | C30B 29/40 117/84 |
| 2005/0206260 A1 | * | 9/2005 | Akiyama | C30B 15/30 310/104 |
| 2015/0114286 A1 | * | 4/2015 | Andreaco | C30B 15/30 117/218 |

\* cited by examiner

PULLING HEAD HAVING A MAGNETIC DRIVE

CROSS REFERENCE TO RELATED APPLICATION

This application claims the benefit under 35 U.S.C. §119(e) of U.S. Provisional Application No. 61/895,423 entitled MAGNETIC DRIVE PULLING HEAD ASM, filed on Oct. 25, 2013 which is incorporated herein by reference in its entirety and to which this application claims the benefit of priority.

FIELD OF THE INVENTION

The invention relates to a pulling head for use in a crystal growing process, and more particularly, to a pulling head having a rotatable housing that includes housing magnets wherein the pulling head also includes a connection device for rotating a pulling rod wherein the connection device includes connection magnets and wherein the housing magnets and connection magnets repel each other and rotation of the housing is transmitted by the magnetic repulsion forces to the connection device to rotate the connection device and the pulling rod.

BACKGROUND OF THE INVENTION

A Czochralski crystal growth technique is frequently used to grow single crystals. In this technique, a melt is formed by heating a material in a crucible. A single crystal is then grown by withdrawing a rotating seed crystal that is in contact with the melt. As the seed crystal is withdrawn or pulled from the crucible, the melt solidifies on the seed. A pulling head arrangement, which is part of a crystal growth furnace apparatus, is typically used to pull the single crystal.

An oxyorthosilicate material may be used to form a single crystal. For example, single crystals fabricated from an oxyorthosilicate material may be used in detectors for positron emission tomography (PET) medical scanners utilized in molecular imaging. An oxyorthosilicate crystal is typically grown in the form of a long cylindrical boule. The boule is grown until a target weight is achieved to form a full size boule. A relatively large capacity load cell or scale is used to weigh a full size boule. On the other hand, the boule is relatively light during initial stages of formation of the boule.

It is important to be able to determine the weight of the boule during initial stages of formation of the boule. However, the relatively large capacity scales that are used to weigh a full-size boule do not have sufficient resolution to be able to accurately determine the weight of a relatively light boule.

SUMMARY OF INVENTION

A pulling head for use in a crystal growth furnace apparatus is disclosed. The pulling head includes a servomotor and a rotatable housing attached to the servomotor, wherein the housing includes first, second, third and fourth housing magnets. The pulling head also includes a shaft attached to a scale and a connection device having first and second connection magnets. The first connection magnet is arranged between the first and second housing magnets to generate first and second magnetic repulsion forces and the second connection magnet is arranged between the third and fourth housing magnets to generate third and fourth magnetic repulsion forces. A rotation coupling is attached between the shaft and the connection device. The servomotor rotates the housing and rotation of the housing is transmitted by the first, second, third and fourth magnetic repulsion forces to the connection device to rotate the connection device about the first axis.

The connection device is attached to a pulling rod of a crystal growth furnace apparatus. The pulling rod includes a seed holder for holding a seed crystal for initiating formation of a single crystal boule from the melt. The crystal growth furnace apparatus also includes a crucible for holding a melt for forming the boule and a heating element for heating raw material to form the melt wherein the seed crystal extracts the boule from the melt. The scale weighs only the shaft, rotation coupling, connection device, pulling rod, seed holder, seed crystal and the boule thus enabling the use of a lower capacity scale. Use of a lower capacity scale provides additional scale resolution to enable accurate determination of the weight of the boule during initial stages of boule growth. Further, a lower capacity scale used with the pulling head of the current invention has sufficient capacity for weighing a full size boule.

The respective features of the present invention may be applied jointly or severally in any combination or subcombination by those skilled in the art.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
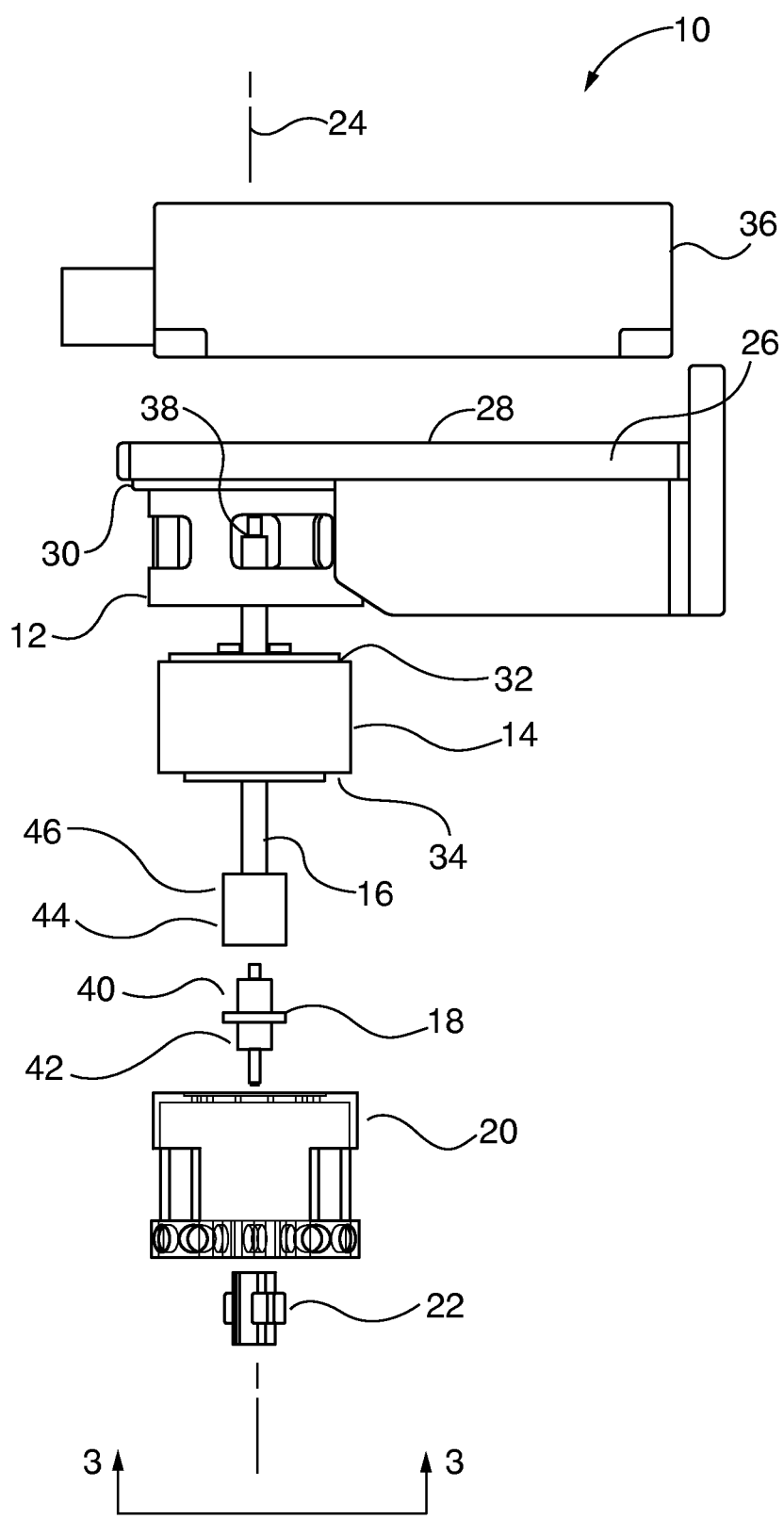
FIG. 1 is an exploded view of a pulling head apparatus for use in a crystal growth furnace apparatus.

Although various embodiments that incorporate the teachings of the present invention have been shown and described in detail herein, those skilled in the art can readily devise many other varied embodiments that still incorporate these teachings. The invention is not limited in its application to the exemplary embodiment details of construction and the arrangement of components set forth in the description or illustrated in the drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass direct and indirect mountings, connections, supports, and couplings. Further, "connected" and "coupled" are not restricted to physical or mechanical connections or couplings.

Figure 2:
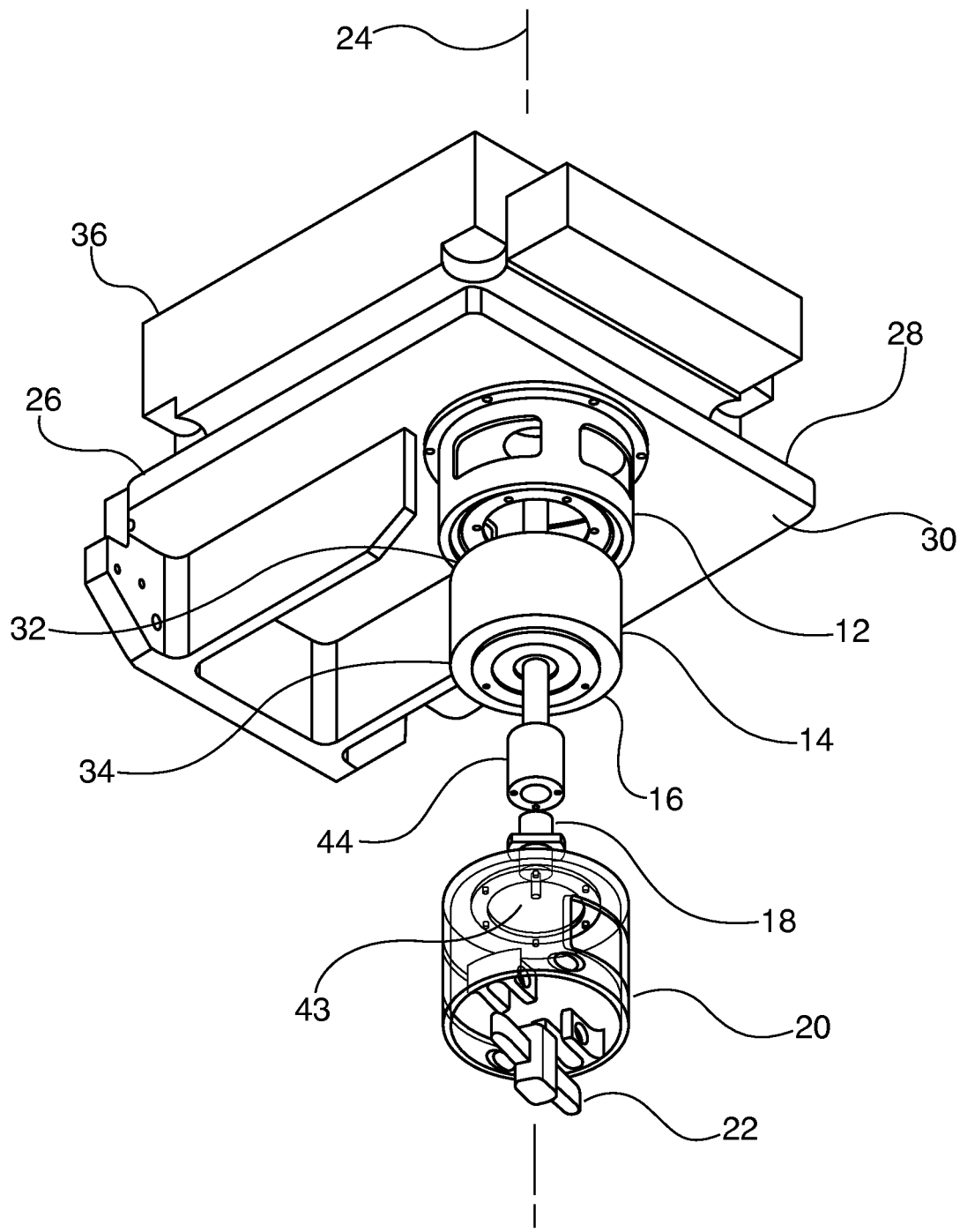
FIG. 2 is a perspective exploded view of the pulling head apparatus.

Referring to FIGS. 1 and 2, exploded views of a pulling head apparatus 10 for use in a crystal growth furnace apparatus are shown. The pulling head 10 includes a motor mount 12, servomotor 14, stationary shaft 16, rotation coupling 18, housing 20 and a connection device 22 that are each aligned on a first axis 24. The pulling head 10 also includes a support base 26 having top 28 and bottom 30 surfaces. The motor mount 12 is attached to the bottom surface 30 of the base 26. A top section 32 of the servomotor 14 is then attached to the motor mount 12. Further, a lower section 34 of the servomotor 14 is rotatably attached to the housing 20. Activation of the servomotor 14 causes rotation of the housing 20 about the first axis 24. A load cell or scale 36 is attached to the top surface 28 of the base 26. The base 26 supports the weight of the motor mount 12, servomotor 14, housing 20 and the scale 36.

The stationary shaft 16 includes an upper end 38 that is attached to the scale 36. The stationary shaft 16 extends from the scale 36 and through the base 26, motor mount 12 and the servo motor 14. The rotation coupling 18 includes upper 40 and lower 42 portions that include upper and lower rotation bearings, respectively. The upper portion 40 is rotatably attached to a scale attachment portion 44 formed on a lower end 46 of the stationary shaft 16. The lower portion 42 extends through an opening 43 (see FIG. 2) in the housing 20 and is rotatably attached to the connection device 22. Of the pulling head 10 components shown in FIGS. 1 and 2, only the stationary shaft 16, rotation coupling 18 and connection device 22 are weighed by the scale 36. As will be described, the connection device 22 is connected to a pulling rod 106 (see FIG. 4).

Figure 3:
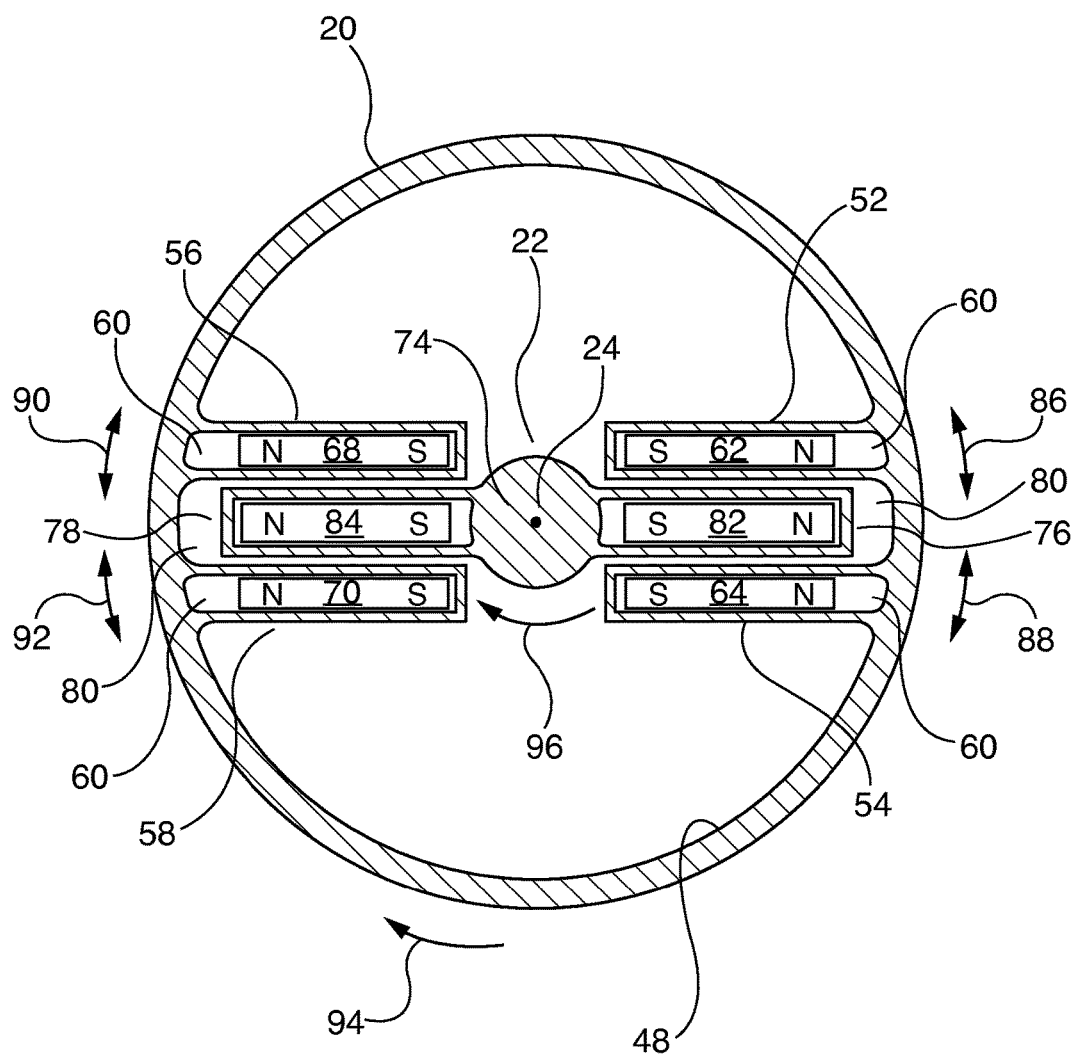
FIG. 3 is a view along view line 3-3 of FIG. 1 and depicts a partial cross sectional view of a housing and connection device.

FIG. 3 is a view along view line 3-3 of FIG. 1 and depicts a partial cross sectional view of the housing 20 and connection device 22. The housing 20 may have a cylindrical shape and includes an interior wall 48 and an interior section 50. First 52 and second 54 housing ribs extend from the interior wall 48 and into the interior section 50. In addition, third 56 and fourth 58 housing ribs extend from an opposite portion of the interior wall 48 and into the interior section 50 toward the first 52 and second 54 ribs. The first 52 and second 54 ribs each include a rib cavity 60 for holding first 62 and second 64 rib magnets, respectively. The third 56 and fourth 58 ribs each include a rib cavity 60 for holding third 68 and fourth 70 rib magnets.

The connection device 22 includes a center section 74 aligned on the first axis 24. First 76 and second 78 arms extend radially outwardly from the center section and are oriented approximately 180 degrees from each other. The first 76 and second 78 arms each include an arm cavity 80 for holding first 82 and second 84 arm magnets, respectively. The first arm 76 is located between the first 52 and second 54 ribs, thereby locating the first arm magnet 82 between the first 62 and second 64 rib magnets. The second arm 78 is located between the third 56 and fourth 58 ribs, thereby locating the second arm magnet 84 between the third 68 and fourth 70 rib magnets. Further, the first arm 76 is spaced apart from the first 52 and second 54 ribs and the second arm 78 is spaced apart from the third 56 and fourth 58 ribs. In an embodiment, the first 62, second 64, third 68 and fourth 70 rib magnets and the first 82 and second 84 arm magnets may be permanent magnets fabricated from neodymium although it is understood that other magnet materials and/or types of magnets may be used.

The first arm magnet 82 and the first 62 and second 64 rib magnets are arranged such that like poles of the first 62 and second 64 rib magnets and the first arm magnet 82 are located adjacent each other. This generates first 86 and second 88 magnetic repulsion forces that cause the first arm magnet 82 and the first rib magnet 62, and the first arm magnet 82 and second rib magnet 64, respectively, to repel each other. In addition, the second arm magnet 84 and the third 68 and fourth 70 rib magnets are positioned such that like poles of the third 68 and fourth 70 rib magnets and the second 84 arm magnet are positioned adjacent each other. This generates third 90 and fourth 92 magnetic repulsion forces that cause the second arm magnet 84 and the third rib magnet 68, and the second arm magnet 84 and the fourth rib magnet 70, respectively, to repel each other. The first 86, second 88, third 90 and fourth 92 magnetic repulsion forces act in a direction substantially perpendicular to the first axis 24. Thus, the first arm 76 is magnetically levitated between the first 52 and second 54 ribs and the second arm 78 is magnetically levitated between the third 56 and 58 fourth ribs. In accordance with the invention, activation of the servomotor causes rotation 94 of the housing 20 about the first axis 24. The rotation 94 is then transmitted by the first 86, second 88, third 90 and fourth 92 magnetic repulsion forces to the connection device 22 to induce or cause corresponding rotation 96 of the connection device 22 and the rotation coupling 18 about the first axis 24.

In an exemplary embodiment, north and poles (i.e. "N" and "S", respectively, in FIG. 3) of the first 82 and second 84 arm magnets are located radially outward and inward, respectively, relative to the first axis 24. Further, the north and south poles of the first 62, second 64, third 68 and fourth 70 rib magnets and the first 82 and second 84 arm magnets are arranged such that each of the north poles are adjacent each other and each of the south poles are adjacent each other so as to generate the first 86, second 88, third 90 and fourth 92 magnetic repulsion forces.

In another embodiment, the connection device 22 may include a single radially extending arm 76 having the first arm magnet 82. In this embodiment, the housing 20 includes a single pair of housing ribs that include the first 52 and second 54 ribs having the first 62 and second 64 rib magnets arranged to form the first 86 and second 88 magnetic repulsion forces. Alternatively, the connection device 22 includes more than two radially extending arms 76,78 each having arm magnets 82,84. In this embodiment, the arms 76,78 are each associated with a pair of housing ribs 52,54 each having rib magnets 62,64 thereby forming more than two pairs of housing ribs 52,54 wherein the arm magnets 82,84 and rig magnets 62,64 are arranged for generating associated magnetic repulsion forces. In a further embodiment, the connection device 22 may include at least one radially extending arm 76 having the first arm magnet 82. In this embodiment, the housing 20 may include an associated single rib element that includes the first rib 52 having the first rib magnet 62 wherein the first arm magnet 82 and the first rib magnet 62 repel each other to form a single magnetic repulsion force 86.

Figure 4:
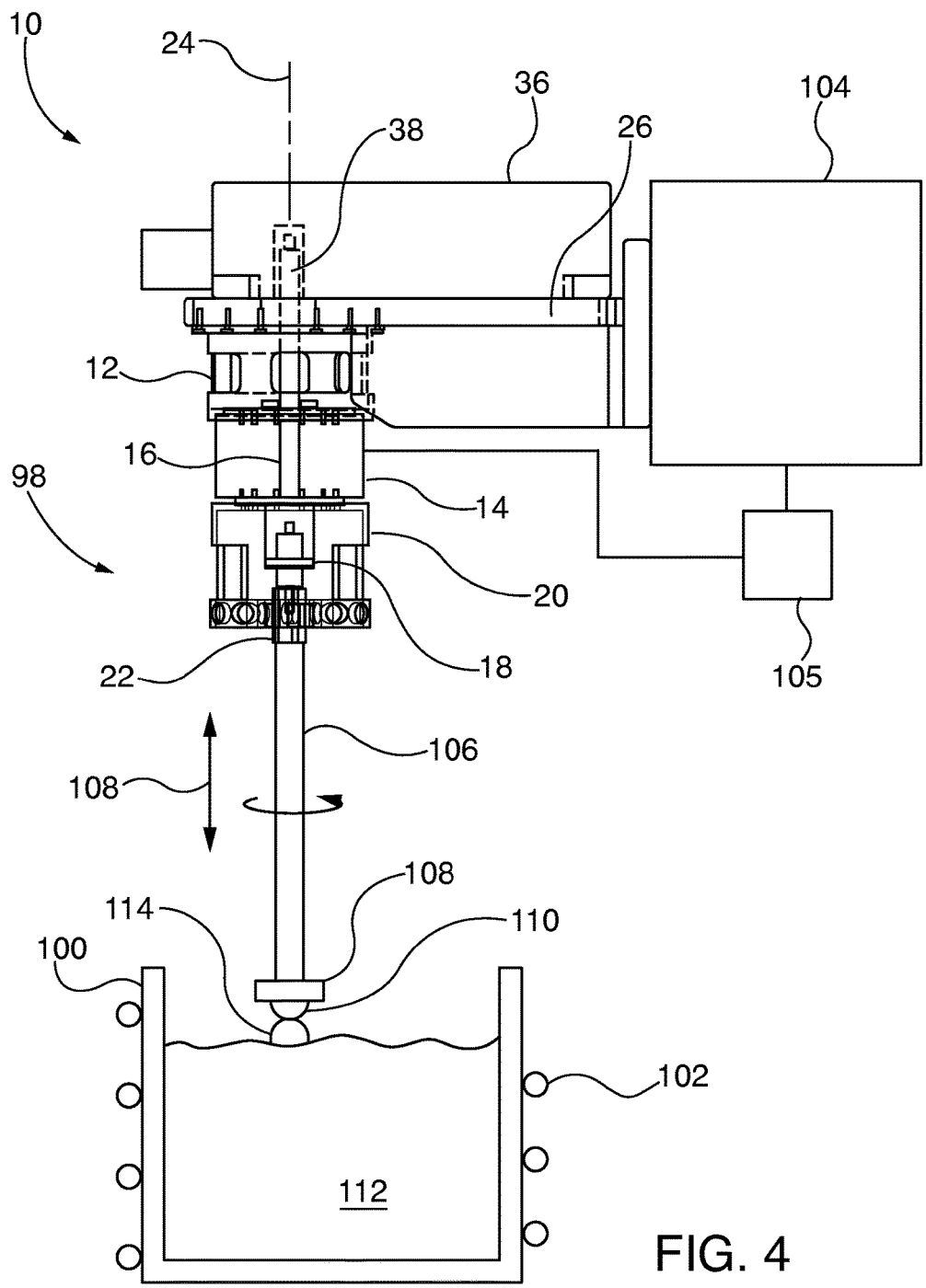
FIG. 4 depicts a crystal growth furnace apparatus in accordance with an embodiment of the present invention.

Referring to FIG. 4, a crystal growth furnace apparatus 98 in accordance with an embodiment of the present invention is shown. The apparatus 98 may be used to implement a Czochralski crystal growth technique. The apparatus 98 includes the pulling head 10, a crucible 100, heating element 102, which may include by way of example a known RF heating element, a linear drive 104 which serves to move the pulling head 10 and in a vertical direction 108 and a controller 105 communicatively coupled to the servomotor 14 and the linear drive 104.

As previously described, the pulling rod 106 is attached to the connection device 22. The pulling rod 106 includes a seed holder 108 for holding a seed crystal 110. During operation, the controller 105 activates the servomotor 14 to cause rotation 94 of the housing 20, connection device 22 pulling rod 106, seed holder 108 and seed crystal 110 about the first axis 24. The controller 105 also activates the linear drive 104 to move the pulling head 10 in the vertical direction 108. Therefore, the pulling rod 106 moves in a vertical direction 108 along the first axis 24 as it rotates about the first axis 24. The crucible 100 holds raw material suitable for forming a single crystal. The raw material may be, for example, an oxyorthosilicate material or a combination of materials suitable for forming a single crystal.

The heating element 102 is positioned around sides of the crucible 100. The heating element 102 serves to heat crucible 100 in order to heat the raw material to a suitable temperature for forming a melt 112. In operation, the heating element 102 is activated to heat the raw material and form the melt 112. The seed crystal 110 is used to initiate the formation of a single crystal from the melt 112. The pulling rod 106 is rotated about the first axis 24 and lowered along the first axis 24 until the seed crystal 110 contacts the melt 112. This causes partial melting of the seed crystal 110 after which an equilibrium is established between the seed crystal 110 and the melt 112 so that there is neither melting nor crystallization of the seed crystal 110. The pulling rod 106 is then slowly raised and the seed crystal 110 is pulled out of the melt 112 as the pulling rod 106 rotates to gradually extract a single crystal in the form of a boule 114. The boule 114 is extracted until a target weight for the boule 114 is achieved to form a full size boule. In other embodiments, both the pulling rod 106 and crucible 100 are rotated wherein the crucible 100 is rotated in an opposite direction than the direction in which pulling rod 106 is rotated. Alternatively, only the crucible 100 is rotated. Several parameters affect formation of the boule including rotation speed, temperature and the rate at which the seed holder 108 is withdrawn from the melt 112.

The scale 36 is used to determine the weight of a full size boule. It is important to be able to determine the weight of the boule 114 during initial stages of boule formation, i.e., when the boule 114 is initially extracted from the melt 112. In conventional pulling heads, a servomotor, drive coupling and associated components undesirably exert a load on the scale.

In accordance with the invention, only the stationary shaft 16, rotation coupling 18, connection device 22, pulling rod 106, seed holder 108, seed crystal 110 and boule 114 exert a load on the scale 36. Further, the weight of the motor mount, 12 servomotor 14 and housing 20 is supported by the base 26 and thus the weight of these components do not exert a load on the scale 36. Therefore, a lower capacity scale 36 may be used to weigh the boule 114. This provides additional scale resolution to enable accurate determination of the weight of the boule 114 during initial stages of boule growth. Further, the lower capacity scale 36 has sufficient capacity for weighing a full size boule.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A pulling head for use in a crystal growth furnace apparatus, wherein the pulling head includes a support base, comprising:
    a servomotor attached to the support base;
    a rotatable housing attached to the servomotor, wherein the housing includes at least one housing magnet;
    a scale attached to the support base;
    a shaft attached to a scale;
    a connection device having at least one connection magnet wherein the at least one housing magnet and the at least one connection magnet repel each other to form a magnetic repulsion force about a first axis; and
    a rotation coupling attached between the shaft and the connection device wherein the scale weighs the shaft, rotation coupling and the connection device and wherein the servomotor rotates the housing and rotation of the housing is transmitted by the magnetic repulsion force to the connection device to rotate the connection device about the first axis.

2. The pulling head according to claim 1, wherein like magnetic poles of the at least one connection magnet and the at least one housing magnet are located adjacent each other to generate the magnetic repulsion force.

3. The pulling head according to claim 2, wherein north and south poles of the at least one connection magnet are located radially outward and inward, respectively, relative to the first axis.

4. The pulling head according to claim 1, the connection device includes an arm for holding the at least one connection magnet and the housing includes a rib for holding the at least one housing magnet.

5. The pulling head according to claim 1, wherein the at least one connection magnet and the at least one housing magnet are each permanent magnets.

6. The pulling head according to claim 1, wherein the at least one connection magnet and the at least one housing magnet are fabricated from neodymium.

7. A pulling head for use in a crystal growth furnace apparatus, wherein the pulling head includes a support base, comprising:
    a servomotor attached to the support base;
    a rotatable housing attached to the servomotor, wherein the housing includes first, second, third and fourth housing magnets;
    a scale attached to the support plate;
    a shaft attached to the scale;
    a connection device having first and second connection magnets wherein the first connection magnet is arranged between the first and second housing magnets to generate first and second magnetic repulsion forces and the second connection magnet is arranged between the third and fourth housing magnets to generate third and fourth magnetic repulsion forces; and
    a rotation coupling attached between the shaft and the connection device wherein the scale weighs the shaft, rotation coupling and the connection device and wherein the servomotor rotates the housing and rotation of the housing is transmitted by the first, second, third and fourth magnetic repulsion forces to the connection device to rotate the connection device about the first axis.

8. The pulling head according to claim 7, wherein like magnetic poles of the first connection magnet and the first and second housing magnets are located adjacent each other and like magnetic poles of the second connection magnet and the third and fourth housing magnets are located adjacent each other to generate the first, second, third and fourth magnetic repulsion forces.

9. The pulling head according to claim 8, wherein north and south poles of the first and second connection magnets are located radially outward and inward, respectively, relative to the first axis.

10. The pulling head according to claim 7, the connection device includes first and second arms for holding the first and second connection magnets and the housing includes first, second, third and fourth ribs for holding the first, second, third and fourth housing magnets.

11. The pulling head according to claim 7, wherein the first and second connection magnets and the first, second, third and fourth housing magnets are each permanent magnets.

12. The pulling head according to claim 7, wherein the first and second connection magnets and the first, second, third and fourth housing magnets are fabricated from neodymium.

13. A crystal growth furnace apparatus, comprising:
a servomotor attached to a support base;
a rotatable housing attached to the servomotor, wherein the housing includes first, second, third and fourth housing magnets;
a scale attached to the support base;
a shaft attached to the scale;
a connection device having first and second connection magnets wherein the first connection magnet is arranged between the first and second housing magnets to generate first and second magnetic repulsion forces and the second connection magnet is arranged between the third and fourth housing magnets to generate third and fourth magnetic repulsion forces;
a pulling rod attached to the connection device, the pulling rod having a seed holder for holding a seed crystal for initiating formation of a single crystal boule from a melt;
a crucible for holding the melt for forming the boule;
a heating element for heating raw material to form the melt wherein the seed crystal extracts the boule from the melt; and
a rotation coupling attached between the shaft and the connection device wherein the scale weighs the shaft, rotation coupling, connection device, pulling rod, seed holder, seed crystal and the boule and wherein the servomotor rotates the housing and rotation of the housing is transmitted by the first, second, third and fourth magnetic repulsion forces to the connection device to rotate the connection device about the first axis.

14. The pulling head according to claim 13, wherein like magnetic poles of the first connection magnet and the first and second housing magnets are located adjacent each other and like magnetic poles of the second connection magnet and the third and fourth housing magnets are located adjacent each other to generate the first, second, third and fourth magnetic repulsion forces.

15. The pulling head according to claim 14, wherein north and south poles of the first and second connection magnets are located radially outward and inward, respectively, relative to the first axis.

16. The pulling head according to claim 13, the connection device includes first and second arms for holding the first and second connection magnets and the housing includes first, second, third and fourth ribs for holding the first, second, third and fourth housing magnets.

17. The pulling head according to claim 13, wherein the first and second connection magnets and the first, second, third and fourth housing magnets are each permanent magnets.

18. The pulling head according to claim 13, wherein the first and second connection magnets and the first, second, third and fourth housing magnets are fabricated from neodymium.

19. The pulling head according to claim 13, further including a motor mount located between servomotor and the support base.

20. The pulling head according to claim 19, wherein the motor mount, servomotor and housing are supported by the base.

* * * * *